(12) United States Patent
Suematsu et al.

(10) Patent No.: US 7,714,579 B2
(45) Date of Patent: May 11, 2010

(54) NMR PROBE

(75) Inventors: Hiroto Suematsu, Tokyo (JP); Yoshiki Kida, Tokyo (JP); Yoshiaki Yamakoshi, Tokyo (JP); Hiroshi Ikeda, Tokyo (JP); Tetsuo Miyamoto, Tokyo (JP); Ryoji Tanaka, Tokyo (JP)

(73) Assignee: Jeol Ltd., Tokyo (JP)

( * ) Notice: Subject to any disclaimer, the term of this patent is extended or adjusted under 35 U.S.C. 154(b) by 149 days.

(21) Appl. No.: 12/129,060

(22) Filed: May 29, 2008

(65) Prior Publication Data

US 2008/0297156 A1    Dec. 4, 2008

(30) Foreign Application Priority Data

May 29, 2007    (JP)    ............... 2007-141190

(51) Int. Cl.
 *G01V 3/00* (2006.01)
(52) U.S. Cl. ................................. 324/318
(58) Field of Classification Search ......... 324/300–322; 600/410–435; 333/219–235; 343/725–730, 343/741–748, 824–831, 893
See application file for complete search history.

(56) References Cited

U.S. PATENT DOCUMENTS

| 6,686,741 | B2 * | 2/2004 | Hasegawa | .................... 324/322 |
| 7,081,753 | B2 * | 7/2006 | Mullen et al. | ............... 324/318 |
| 7,292,038 | B2 * | 11/2007 | Doty | ........................ 324/318 |

FOREIGN PATENT DOCUMENTS

JP    2003-121523    4/2003

* cited by examiner

*Primary Examiner*—Brij B Shrivastav
*Assistant Examiner*—Dixomara Vargas
(74) *Attorney, Agent, or Firm*—The Webb Law Firm

(57) ABSTRACT

An NMR probe permits measurements to be made with its inner coil without replacing the probe. The NMR probe has three coils disposed to surround a sample tube. An inner coil can resonate with the HF and LF. An intermediate coil can resonate with the HF and LF, and produces an RF magnetic field perpendicular to the RF field produced by the inner coil. An outermost coil can resonate at least at a lock frequency. The outermost coil produces an RF magnetic field which is perpendicular to the RF field produced by the intermediate coil but which is coincident in direction with the RF field produced by the inner coil.

14 Claims, 4 Drawing Sheets

NMR PROBE

BACKGROUND OF THE INVENTION

1. Field of the Invention

The present invention relates to an NMR probe for use in an NMR spectrometer and, more particularly, to an NMR probe permitting observation and irradiation of numerous kinds of nuclei.

2. Description of Related Art

An NMR spectrometer is an instrument for analyzing a molecular structure by irradiating a sample placed within a static magnetic field with an RF signal, then detecting a feeble RF signal (NMR signal) emanating from the sample, and extracting information about the molecular structure contained in the signal.

FIG. 1 is a schematic block diagram of the NMR spectrometer. The spectrometer has an RF oscillator 1 producing an RF signal. The RF signal is controlled in terms of phase and amplitude by a phase controller 2 and an amplitude controller 3 and sent to a power amplifier 4.

The RF signal is amplified to an electric power necessary to excite an NMR signal by the power amplifier 4 and sent to an NMR probe 6 via a duplexer 5. Then, the signal is applied to the sample from a detection coil (not shown) placed within the NMR probe 6.

After the RF irradiation, a feeble NMR signal emanating from the sample is detected by the detection coil (not shown) placed within the NMR probe 6 and sent to a preamplifier 7 again via the duplexer 5. In the preamplifier 7, the signal is amplified to a signal level at which the signal can be picked up.

A receiver 8 converts the frequency of the RF NMR signal amplified by the preamplifier 7 to an audio frequency that can be converted into a digital signal. At the same time, the receiver controls the amplitude. The NMR signal converted into the audio frequency by the receiver 8 is converted into a digital signal by an analog-to-digital data converter 9 and sent to a control computer 10.

The control computer 10 controls the phase controller 2 and amplitude controller 3, Fourier-transforms the NMR signal accepted in the time domain, automatically corrects the phase of the Fourier-transformed NMR signal, and then displays the NMR signal as an NMR spectrum.

There are many kinds of RF waves applied to the NMR probe 6. In particular, RF waves corresponding to the resonant frequency of any one of nuclear species as shown in the following Table 1 are applied to the NMR probe.

TABLE 1

| Resonant Frequency at 18 Tesla (MHz) | | | | | |
|---|---|---|---|---|---|
| Kinds of Nuclei | Resonant Frequency | Kinds of Nuclei | Resonant Frequency | Kinds of Nuclei | Resonant Frequency |
| $^3$H | 800 | $^{27}$Al | 195 | $^{15}$N | 76 |
| $^1$H | 750 | $^{13}$C | 189 | $^{35}$Cl | 74 |
| $^{19}$F | 706 | $^{79}$Br | 188 | $^{14}$N | 54 |
| $^{205}$Tl | 433 | $^{29}$Si | 149 | $^{39}$K | 35 |
| $^{31}$P | 304 | $^{199}$Hg | 134 | $^{99}$Ru | 35 |
| $^7$Li | 292 | $^2$H | 115 | $^{183}$W | 31 |
| $^{119}$Sn | 280 | $^6$Li | 110 | $^{103}$Rh | 24 |
| $^{11}$B | 241 | $^{17}$O | 102 | | |

In Table 1, the chemical symbols on the left side of each column of the table indicate the kinds of nuclei under observation, while the numerical values on the right side indicate the resonant frequencies (in MHz) of the observed nuclei in a case where they are placed within a static magnetic field of 18 Tesla (T).

In the following description, let HF be the RF waves of frequencies corresponding to the resonant frequencies of $^3$H nuclei to $^{19}$F nuclei. Let LF be RF waves having frequencies lower than the resonant frequency of $^{205}$Tl. LOCK is an abbreviation of RF waves having a lock frequency using deuterium nuclei.

FIGS. 2A and 2B show one example of an NMR probe of a type called the inverse probe. In this type of NMR probe, there are two detection coils which are disposed to surround a sample tube.

One of the two coils is an inner coil 11 for observing HF. The inductance of the inner coil is so set that it doubly resonates with HF and LOCK. The other is an outer coil 12 for applying LF for decoupling purposes. The inductance of the outer coil is so set that LF having a frequency capable of being varied over a wide range can be covered efficiently. In this probe, HF is observed with the inner coil 11 closer to the sample under investigation and, therefore, HF is detected with enhanced sensitivity.

The inner coil 11 and outer coil 12 are so disposed that RF magnetic fields produced by them are perpendicular to each other in direction. This probe is termed the HX probe due to the fact that RF waves injected into the inner and outer coils are various HF nuclei (typified by hydrogen nuclei and hereinafter referred to as H nuclei) and various LF nuclei (hereinafter referred to as X nuclei), respectively.

An inner coil subassembly (indicated by the circuit diagram in the right top portion of FIG. 2B) including the inner coil 11 has an HF input/output terminal 13 and a LOCK input/output terminal 14. The inner coil is matched and tuned to HF by a matching variable capacitor VC1 for HF and by a tuning variable capacitor VC3 for HF. The inner coil is matched and tuned to LOCK by a matching variable capacitor VC2 for lock and by a tuning variable capacitor VC4 for lock.

An outer coil subassembly (indicated by the circuit diagram in the right bottom portion of FIG. 2B) including the outer coil 12 has an LF input/output terminal 15. The outer coil is matched and tuned to LF by a matching variable capacitor VC5 for LF and by a tuning variable capacitor VC6 for LF.

A capacitor C1 cooperates with the variable capacitor VC1 to match the inner coil to HF. Another capacitor C2 cooperates with a coil L1, the inner coil 11, a coil L2, and the variable capacitor VC4 and resonates the inner coil at the LOCK frequency. The coil L1 keeps high the impedance of the inner coil 11 at the HF frequency and prevents the HF frequency from escaping to ground. The coil L2 prevents the HF frequency from leaking to the LOCK input/output terminal 14 and to ground.

In contrast, FIG. 3 shows one example of an NMR probe of a type known as the tunable probe. Because the inner coil side is tunable, the probe is also referred to as the TH probe. This type of NMR probe also has two detection coils which are disposed to surround a sample tube. The difference with the inverse probe (HX probe) is only that the inner coil 11 is used to observe LF while the outer coil 12 is used to apply radiation for decoupling HF, i.e., the positional relationships of the inner and outer coils are reversed. In this probe, LF is observed with the inner coil 11 closer to the sample under investigation and so LF is detected with enhanced sensitivity. The inner coil 11 and outer coil 12 of the TH probe are also arranged such that the magnetic fields produced by the coils are perpendicular to each other in direction.

In either type of probe, an NMR locking function is often attached. In almost all cases, NMR lock is used, employing resonance frequency of deuterium nuclei ($^2$H nuclei). Because the resonant frequency of deuterium nuclei is about one-sixth as high as the HF frequency, deuterium nuclei are often doubly resonated with an HF coil because of ease of realization of the circuit configuration. If one attempts to achieve the NMR lock using an LF coil, the circuit configuration cannot be easily realized because the resonant frequency of deuterium nuclei is included within the range of LF frequencies. In practice, an example in which the LF coil resonates the probe with LOCK is not general. An HF coil resonates the probe with LOCK (i.e., double resonance).

The prior art probe types, inner and outer coils, and assignments of HF, LF, and LOCK are summarized in Table 2.

TABLE 2

| Probe Type | Inner Coil | Outer Coil |
|---|---|---|
| HX an inverse | HF (observation channel) LOCK | LF |
| TH a tunable | LF (observation channel) | HF LOCK |

In the prior art probe (see JP2003-121523), the coil for observing and irradiating HF is clearly distinguished from the coil for observing and irradiating LF, regardless of whether it is an inverse probe or a tunable probe. Therefore, if one attempts to make observations with the inner coil having higher detection sensitivity, plural probes must be prepared according to whether the resonant frequency of the nuclei of interest is HF or LF. Hence, there is the problem that the used probe must be exchanged according to the purpose.

SUMMARY OF THE INVENTION

In view of the foregoing, it is an object of the present invention to provide an NMR probe which can make observations with its inner coil at all times without replacing the probe whether HF measurements or LF measurements are made.

An NMR probe according to one embodiment of the present invention has three coils forming layers radially spaced from each other. The layers of the coils are disposed to surround a sample tube. One of the coils is an inner coil capable of multiply resonating with a high-frequency (HF) wave having a frequency corresponding to a resonant frequency of any one of $^3$H nuclei to $^{19}$F nuclei and with a high frequency (LF) wave lower than the resonant frequency of $^{205}$Tl. One of the coils is an intermediate coil capable of multiply resonating with HF and LF. The intermediate coil produces an RF magnetic field perpendicular in direction to the RF magnetic field produced by the inner coil. The remaining one of the coils is an outermost coil capable of resonating with at least locking RF waves (abbreviated LOCK; normally, $^2$H nuclei). The outermost coil produces an RF magnetic field which is perpendicular in direction to the RF magnetic field set up by the intermediate coil but is coincident in direction with the RF magnetic field produced by the inner coil. First, second, and third tuning-and-matching circuits are connected with the three coils, respectively. The first tuning-and-matching circuit is connected with the inner coil and capable of being multiply tuned to at least two different frequencies selected from a range from LF to HF. The second tuning-and-matching circuit is connected with the intermediate coil and capable of being multiply tuned to at least two different frequencies selected from the range from LF to HF. The third tuning-and-matching circuit is connected with the outmost coil and capable of being tuned to at least LOCK.

In one feature of the present embodiment, HF, LF, and LOCK are supplied to the inner coil, intermediate coil, and outermost coil, respectively, during use of the probe.

In another feature of the present embodiment, another LF is supplied to the inner coil during use of the probe.

In a further feature of the present embodiment, LF, HF, and LOCK are supplied to the inner coil, intermediate coil, and outermost coil, respectively, during use of the probe.

In still another feature of the present embodiment, HF, two kinds of LFs, and LOCK are supplied to the inner coil, intermediate coil, and outermost coil, respectively, during use of the probe.

In an additional feature of the present embodiment, another kind of LF is supplied to the inner coil during use of the probe.

In yet another feature of the present embodiment, LF, two kinds of HFs, and LOCK are supplied to the inner coil, intermediate coil, and outermost coil, respectively, during use of the probe.

In still a further feature of the present embodiment, a further kind of LF is supplied to the inner coil during use of the probe.

In a still additional feature of the present embodiment, two kinds of HFs, LF, and LOCK are supplied to the inner coil, intermediate coil, and outermost coil, respectively, during use of the probe.

In a further additional feature of the present embodiment, still another kind of LF is supplied to the intermediate coil during use of the probe.

In yet an additional feature of the present embodiment, during use of the probe, HF and LF are supplied to the inner coil. HF and LF are supplied to the intermediate coil. LOCK is supplied to the outermost coil.

In yet a further feature of the present embodiment, during use of the probe, HF and LF are supplied to the inner coil. Two kinds of LFs are supplied to the intermediate coil. LOCK and HF for irradiation are supplied to the outermost coil.

In an additional feature of the present embodiment, during use of the probe, HF and two kinds of LFs are supplied to the inner coil. LF is supplied to the intermediate coil. LOCK is supplied to the outermost coil.

In an additional feature of the present embodiment, during use of the probe, one desired frequency selected from a range from LF to HF is supplied to the inner coil from a broadband frequency variable oscillator that covers a frequency range from LF to HF. Also, one desired frequency selected from the range from LF to HF is supplied to the intermediate coil from the oscillator. LOCK is supplied to the outermost coil.

The inventive NMR probe constructed as described so far permits observations to be made by its inner coil at all times without replacing the probe whether HF measurements or LF measurements are performed.

Other objects and features will appear in the course of the description thereof, which follows.

DESCRIPTION OF THE PREFERRED EMBODIMENTS

The preferred embodiments of the present invention are hereinafter described with reference with the accompanying drawings.

Embodiment 1

Figure 1:
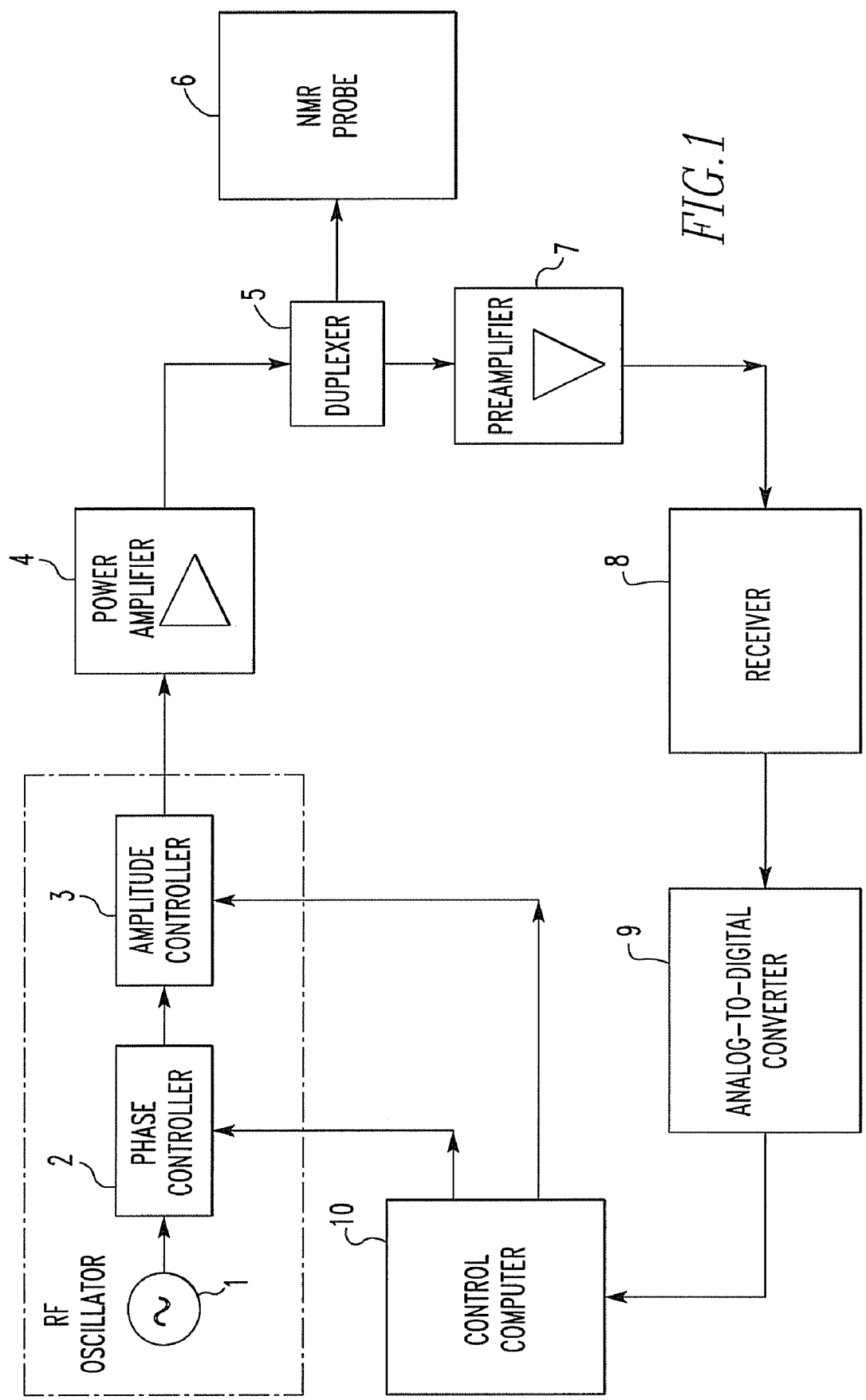
FIG. 1 is a block diagram of a prior art NMR spectrometer.
Figure 2A:
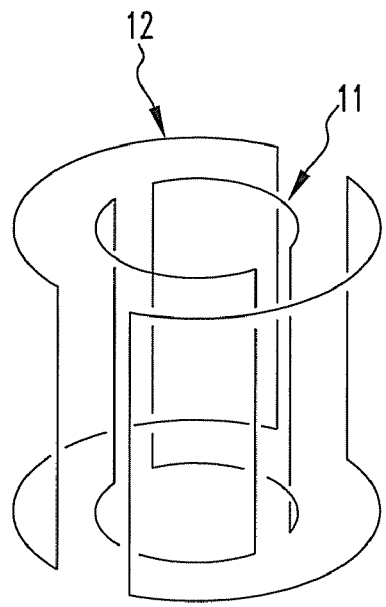
FIGS. 2A and 2B show a schematic perspective view of a prior art NMR probe and an electric circuit diagram thereof.
Figure 2B:
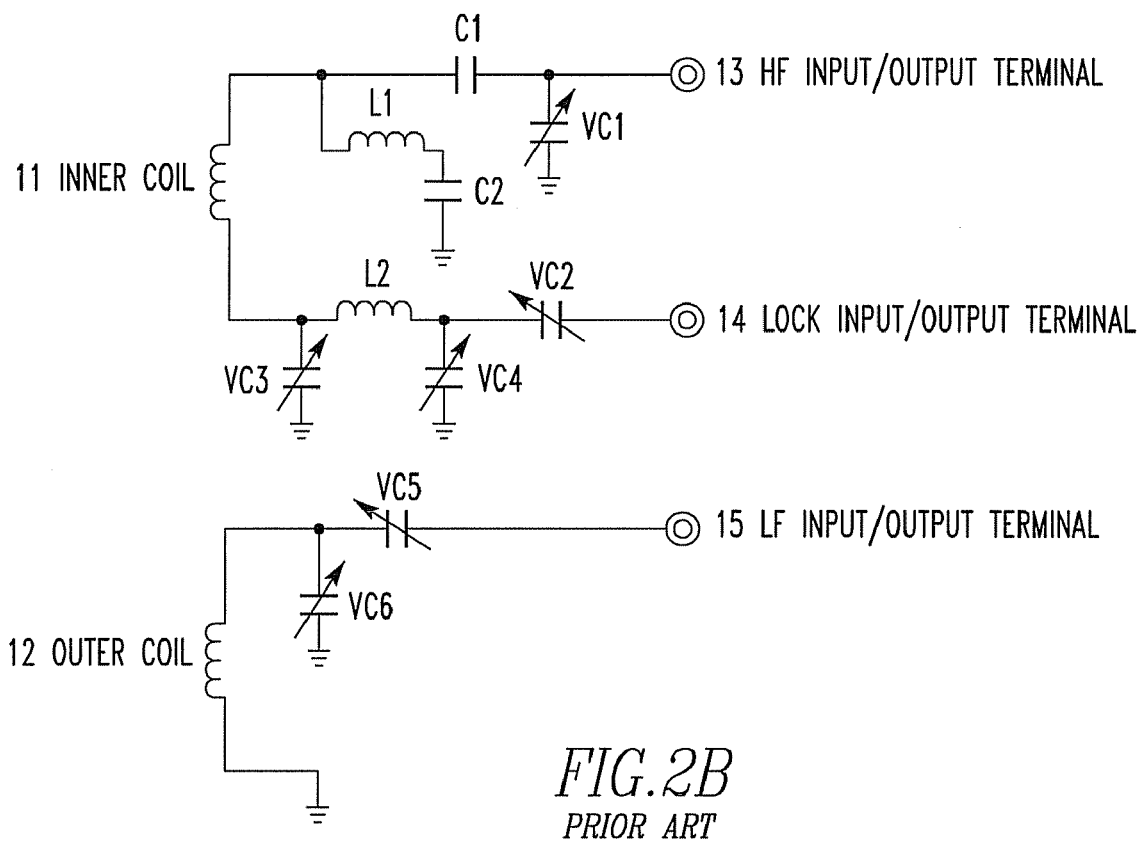
Figure 3:
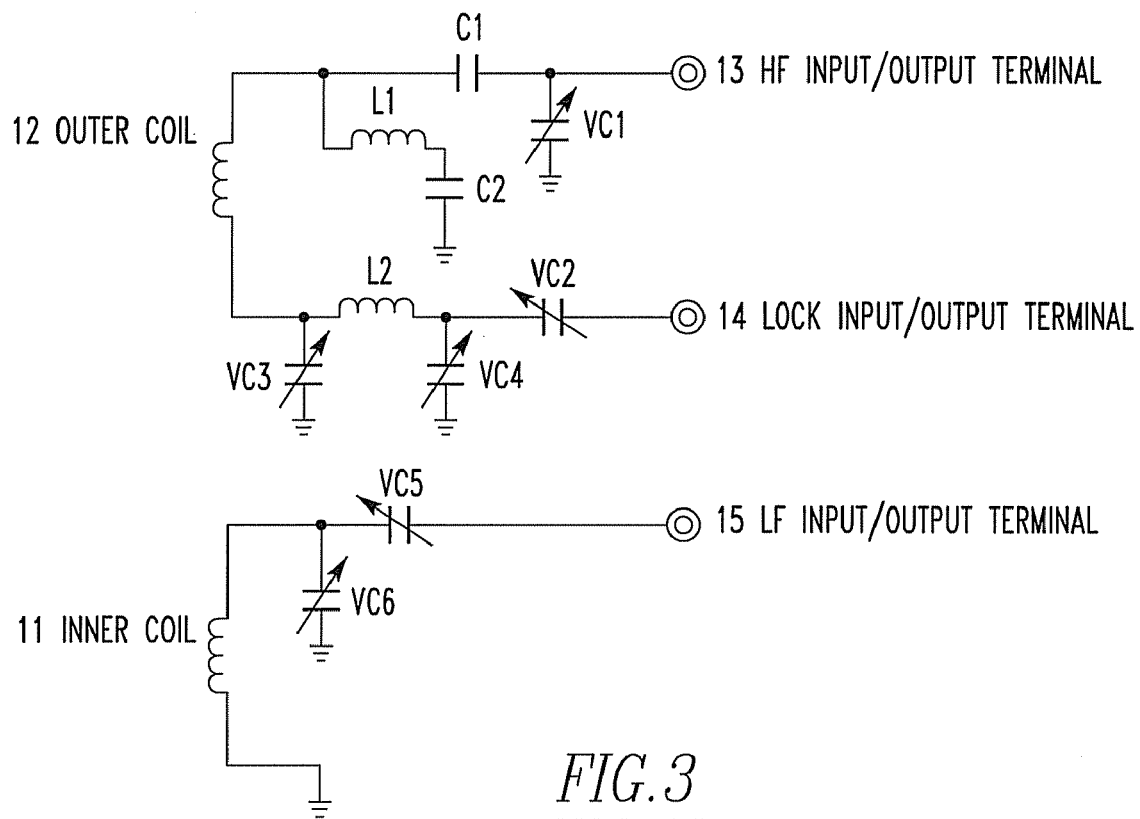
FIG. 3 is an electric circuit diagram of a prior art NMR probe.
Figure 4A:
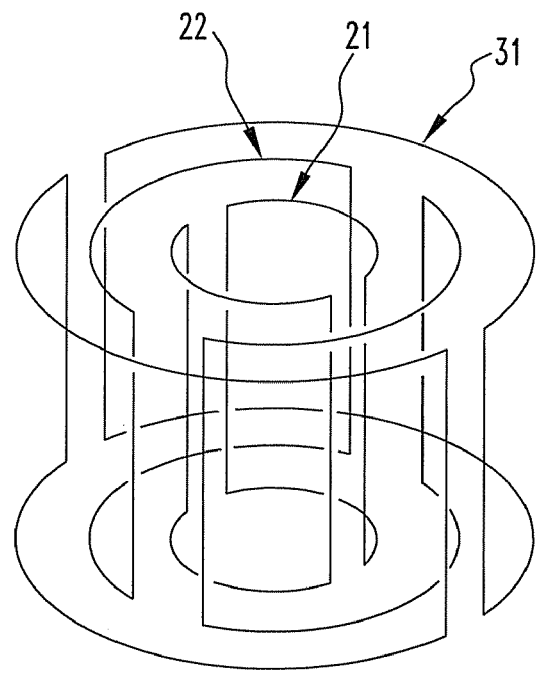
FIGS. 4A and 4B show a schematic perspective view of an NMR probe according to one embodiment of the present invention and an electric circuit diagram of the probe.
Figure 4B:
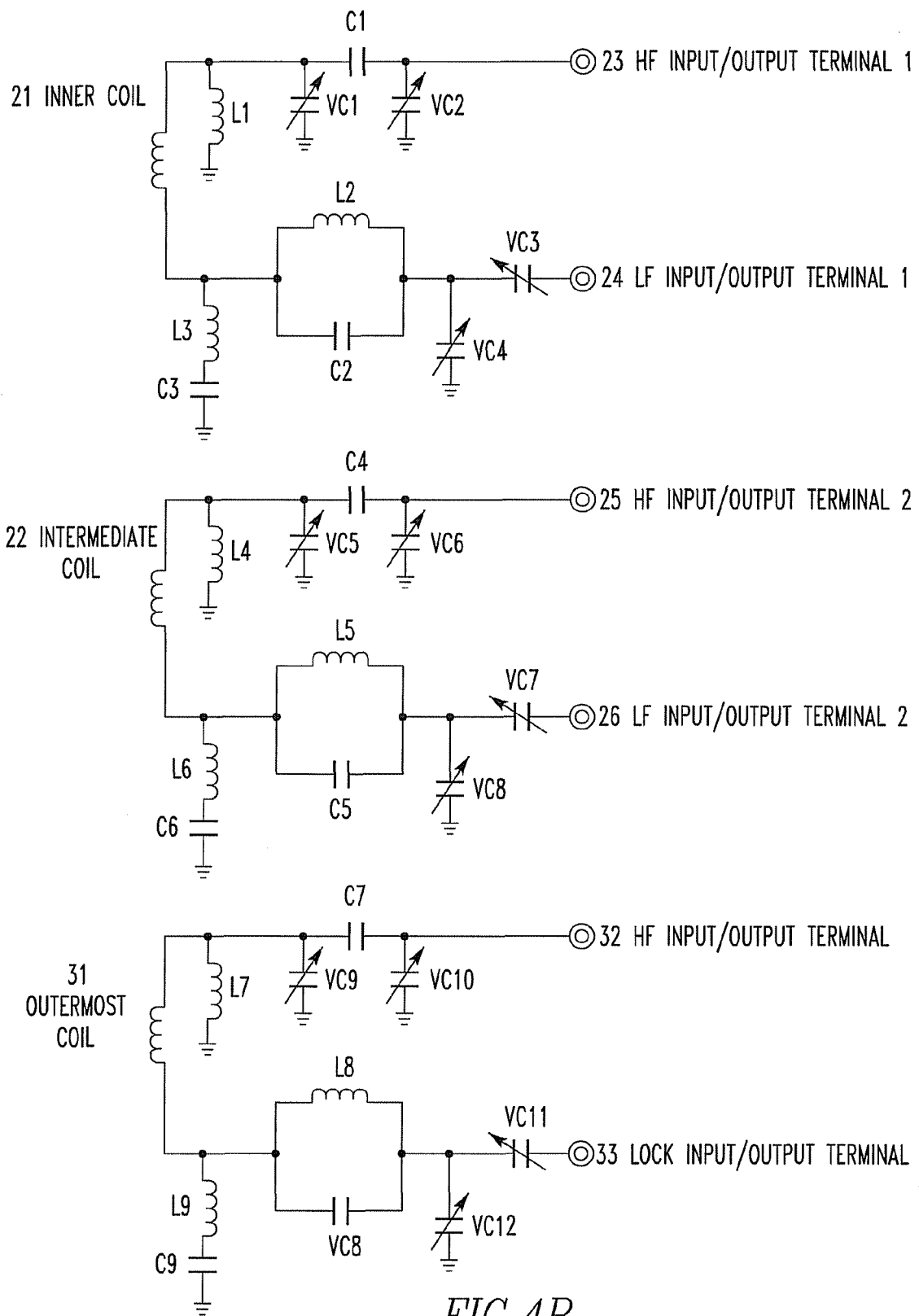

FIGS. 4A and 4B show a novel type of NMR probe according to one embodiment of the present invention. This probe has three detection coils forming layers radially spaced from each other. The layers of the coils are disposed to surround a sample tube (not shown).

One of the detection coils is an inner coil 21 for observing HF and LF. The inductance of the inner coil is so set that it multiply resonates with HF and LF. A second one of the detection coils is an intermediate coil 22 for applying HF and LF for decoupling. The inductance of the intermediate coil is also so set that it multiply resonates with HF and LF. The inner coil 21 and intermediate coil 22 are disposed such that RF magnetic fields produced by them are perpendicular to each other in direction at an accuracy of 90°±less than 10°, more preferably 90°±less than 3°.

The remaining one of the coils is an outermost coil 31 resonating with LOCK and HF. The outermost coil 31 is disposed such that an RF magnetic field produced by the coil 31 is perpendicular in direction to the RF magnetic field produced by the intermediate coil 22 at an accuracy of 90°±less than 10°, more preferably 90°±less than 3°. As a result, the RF magnetic fields produced by the inner coil 21 and outermost coil 31, respectively, are substantially in the same direction. Accordingly, the frequency of LF used in the inner coil 21 is preferably spaced from the frequency of LOCK by at least 3%, more preferably more than 10%, which may differ according to the degree of coupling between the outermost coil and the inner coil, in order to avoid mutual interference. This value gives one example in a case where the resonant frequency of the inner coil is 600 MHz, the resonant frequency of the outermost coil is 92 MHz, and the isolation between both coils is 47 dB.

The axis of the RF magnetic field produced by the inner coil is brought into coincidence with the axis of the RF magnetic field produced by the outermost coil for the following reason. The inner coil and the outermost coil are at the greatest distance. Therefore, the combination of these coils produces less mutual interference than any other combination.

An inner coil subassembly (indicated by the circuit diagram in the right top portion of FIG. 4B) including the inner coil 21 has an HF input/output terminal 23 and an LF input/output terminal 24. The inner coil is matched and tuned to HF by a tuning variable capacitor VC1 for HF, a matching variable capacitor VC2 for HF, and a tuning capacitor C1 or HF. A coil L1 couples the LF frequency to ground and maintains high the impedance of the inner coil at the HF frequency to prevent attenuation of HF. A coil L3 and a capacitor C3 resonate with HF, and couple the HF frequency to ground. The coil L2 and the capacitor C2 resonate with HF and block passage of the HF frequency. The inner coil subassembly further includes a matching variable capacitor VC3 for LF and a tuning variable capacitor VC4 for LF.

An intermediate coil subassembly (indicated by the circuit diagram in the right center portion of FIG. 4B) including the intermediate coil 22 has an HF input/output terminal 25 and an LF input/output terminal 26. The intermediate coil is matched and tuned to HF by a tuning variable capacitor VC5 for HF, a matching variable capacitor VC6 for HF, and a tuning capacitor C4 for HF. A coil L4 couples the LF frequency to ground and maintains high the impedance of the intermediate coil at the HF frequency to prevent attenuation of HF. A coil L6 and a capacitor C6 resonate with HF and couples the HF frequency to ground. A coil L5 and a capacitor C5 resonate with HF and blocks passage of the HF frequency. The intermediate coil subassembly further includes a matching variable capacitor VC7 for LF and a tuning variable capacitor VC8 for LF.

An outermost coil subassembly (indicated by the circuit diagram in the right bottom portion of FIG. 4B) including the outermost coil 31 has an HF input/output terminal 32 and a LOCK input/output terminal 33. The outermost coil is matched and tuned to HF by a tuning variable capacitor VC9 for HF, a matching variable capacitor VC10 for HF, and a tuning capacitor C7 for HF. A coil L7 couples the LF frequency to ground and maintains high the impedance of the outermost coil at the HF frequency to prevent attenuation of HF. A coil L9 and a capacitor C9 resonate with HF and couples the HF frequency to ground. A coil L8 and a capacitor C8 resonate with HF and block passage of the HF frequency. The outermost coil subassembly further includes a matching variable capacitor VC11 for LOCK and a tuning variable capacitor VC12 for LOCK.

When the user wants to observe HF with this NMR probe efficiently, HF for observation is assigned to the inner coil 21, while LF for irradiation is assigned to the intermediate coil 22. NMR lock is achieved by tuning LOCK of the outermost coil 31 to deuterium nuclei. When the user wants to observe LF efficiently, LF for observation is assigned to the inner coil 21, while HF for irradiation is assigned to the intermediate coil 22. NMR lock is achieved by tuning LOCK of the outermost coil 31 to deuterium nuclei. The mode of operation can be arbitrarily switched between these two modes.

Alternatively, HF and LF may be assigned to one coil. HF may be assigned to the other coil. In this case, HF on the inner coil side is used for observation. HF on the intermediate coil side is used for irradiation. That is, HF is assigned to both inner coil and intermediate coil. In practice, F/H measurements in which one HF is $^1$H nuclei while the other HF is $^{19}$F nuclei are being carried out. The present example corresponds to this type of measurement. In this case, LF irradiation can be performed using an LF channel on the inner coil side and/or an LF channel on the intermediate coil side. The mode of operation can be arbitrarily switched among this mode and the two modes described previously.

In this way, LOCK is shifted to the outermost coil. Both inner and intermediate coils multiply resonate with HF and LF. Consequently, various combinations of the coils of the single probe can be assigned. Specific examples of assignments of RF waves in the present invention are summarized in Table 3.

TABLE 3

| probe type | inner coil | intermediate coil | outermost coil | comments |
|---|---|---|---|---|
| an inverse HX | HF (observation channel) | LF | Lock | Efficiency of HF is improved |
| a tunable TH | LF (observation channel) | HF | Lock | Efficiency of HF is improved |
| a triple resonance HCN | HF (observation channel) | 13C, 15N (LF, LF) | Lock | Efficiency of HF is improved |
| a quadruple resonance HCNP | HF (observation channel) 31P (LF) | 13C, 15N (LF, LF) | Lock | Efficiencies of HF and 31P are improved. |
| a tunable triple resonance HCX | HF (observation channel) 13C (LF) | LF | Lock | Efficiencies of HF and 13C are improved. |
| a dual broadband XHY | HF & LF (observation channel) | HF & LF (irradiation channel) | Lock | Realized by this invention. |
| a quintuple resonance HFCNP | 1H (HF, observation channel) 31P (LF) | 13C, 15N (LF, LF) | Lock 195 (HF) | Realized by this invention. |
| a tunable quadruple resonance HCPX | HF (observation channel) 13C (LF) 31P (LF) | LF | Lock | Realized by this invention. |
| a triple resonance TFH | LF | HF, HF | Lock | Realized by this invention. |
| a triple resonance FHX | HF, HF | LF | Lock | Realized by this invention. |
| a quadruple resonance CPFH | LF, LF | HF, HF | Lock | Realized by this invention. |
| a quadruple resonance FHCP | HF, HF | LF, LF | Lock | Realized by this invention. |
| a dual broadband (No. 2) | LF-HF (the whole region) | LF-HF (the whole region) | Lock | Realized by this invention. |

In Table 3, an inverse probe (HX probe) is used in a mode where HF for observation is supplied to the inner coil, LF for irradiation (decoupling) is supplied to the intermediate coil, and LOCK is supplied to the outermost coil. In this form, the inner coil is used with HF alone instead of both HF and LOCK. In consequence, the performance at HF is improved compared with the prior art.

A tunable triple resonance probe (HCX probe where C indicates $^{13}$C nuclei) is used in a mode where further LF for irradiation (such as RF waves for irradiation of $^{13}$C nuclei) is supplied to the inner coil of the inverse probe. In this form, the inner coil is not used with LOCK and, therefore, the performance of the inner coil at HF and LF is improved.

A tunable probe (TH probe) is used in a mode where LF for observation is supplied to the inner coil, HF for irradiation is supplied to the intermediate coil, and LOCK is supplied to the outermost coil. In this form, the intermediate coil is used with HF alone rather than both HF and LOCK. Consequently, the performance at HF is improved.

A triple resonance probe (HCN probe, where N indicates $^{15}$N nuclei) is used in a mode where HF for observation is supplied to the inner coil and two kinds of LFs for irradiation (e.g., RF waves for irradiating $^{13}$C nuclei and RF waves for irradiating $^{15}$N nuclei) are supplied to the intermediate coil. In this case, it is necessary to replace the HF terminal 25 of FIG. 4B and the ancillary tuning-and-matching circuit for HF by a terminal and a tuning-and-matching circuit for LF. In this form, it is avoided that both HF and LOCK are supplied to the same coil. Hence, the performance at HF is improved.

The triple resonance probe can assume some modifications. For example, in one conceivable modification, LF for observation is supplied to the inner coil and two kinds of HFs (e.g., RF waves for irradiating $^1$H nuclei and RF waves for irradiating $^{19}$F nuclei) are supplied to the intermediate coil during use of the probe. In this case, it is necessary to replace the LF terminal 26 of FIG. 4B and the ancillary tuning-and-matching circuit for LF by a terminal and a tuning-and-matching circuit for HF. This is referred to as a TFH probe (where F indicates $^{19}$F nuclei). This form has not been realized until the present invention is made.

Another modification is used in a mode where HF for observation (e.g., RF waves for observation of $^1$H nuclei) and HF for irradiation (e.g., RF waves for irradiating $^{19}$F nuclei) are supplied to the inner coil and where LF for irradiation is supplied to the intermediate coil. In this configuration, it is necessary to replace the LF terminal 24 of FIG. 4B and the ancillary tuning-and-matching circuit for LF by a terminal and a tuning-and-matching circuit for HF. This is referred to as an FHX probe, which has not been achieved until the present invention is made.

A quadruple resonance probe is similar to the triple resonance probe (HCN probe) except that further LF for irradiation is supplied to the inner coil of the triple resonance probe. The quadruple resonance probe is also referred to as an HCNP probe, where P indicates $^{31}$P nuclei. Also, in this case, it is necessary to replace the HF terminal 25 of FIG. 4B and the ancillary tuning-and-matching circuit for HF by a terminal and a tuning-and-matching circuit for LF. In this form, the inner coil is not used with LOCK and so the performance of the inner probe at HF and LF is improved.

The quadruple resonance probe can also be modified. For example, a conceivable modification is used in a mode where two kinds of LFs (e.g., RF waves for $^{13}$C nuclei and RF waves for $^{31}$P nuclei) are supplied to the inner coil and two kinds of HFs (e.g., RF waves for $^1$H nuclei and RF waves for $^{19}$F nuclei) are supplied to the intermediate coil. In this case, the HF terminal 23 of FIG. 4B and the ancillary tuning-and-matching circuit for HF need to be replaced by a terminal and a matching-and-tuning circuit for LF. Furthermore, the LF terminal 26 and the ancillary tuning-and-matching circuit for LF need to be replaced by a terminal and a tuning-and-matching circuit for HF. This is referred to as a CPFH probe, which has not been achieved until the present invention is made.

Another modification is used in a mode where two kinds of HFs (e.g., RF waves for $^1$H nuclei and RF waves for $^{31}$F nuclei) are supplied to the inner coil and where two kinds of LFs (e.g., RF waves for $^{13}$C nuclei and RF waves for $^{31}$P nuclei) are supplied to the intermediate coil. In this structure, the LF terminal 24 of FIG. 4B and the ancillary tuning-and-matching circuit for LF need to be replaced by a terminal and a tuning-and-matching circuit for HF. Furthermore, the HF terminal 25 and the ancillary tuning-and-matching circuit for HF need to be replaced by a terminal and a tuning-and-matching circuit for LF. This is referred to as an FHCP probe, which has not been achieved until the present invention is made.

A dual broadband probe (XHY probe, where the second LF nucleus is referred to as the Y nucleus) is used in a mode where HF for observation and LF for observation are supplied to the inner coil, HF for irradiation and LF for irradiation are supplied to the intermediate coil, and LOCK is supplied to the outermost coil. This form has not been achieved until the present invention is made.

The dual broadband probe may also be used in a mode where one desired frequency selected from a range from LF to HF is supplied to the inner coil and one desired frequency selected from the range from LF to HF is supplied to the intermediate coil from a broadband frequency variable oscillator that covers a frequency range from LF to HF. LOCK is supplied to the outermost coil. This form has not been achieved until the present invention is made.

A quintuple resonance probe (HFCNP probe) can be used in the following mode. HF for observation and LF for irradiation are supplied to the inner coil. Two kinds of LFs for irradiation are supplied to the intermediate coil. LOCK and HF for irradiation are supplied to the outermost coil. In this structure, too, the HF terminal 25 of FIG. 4B and the ancillary tuning-and-matching circuit for HF need to be replaced by a terminal and a tuning-and-matching circuit for LF. This form has not been achieved until the present invention is made.

A tunable quadruple resonance probe (HCPX probe) is used in the following mode. HF for observation and two kinds of LFs for irradiation are supplied to the inner coil. LF for irradiation is supplied to the intermediate coil. LOCK is supplied to the outermost coil. This structure needs the LF terminal 24 of FIG. 4B and the ancillary tuning-and-matching circuit for LF. In addition, it is necessary to provide a second LF terminal and an ancillary tuning-and-matching circuit for LF. This form has not been achieved until the present invention is made.

It is also conceivable to mount further coils, such as fourth and fifth coils, outside the outermost coil. However, restrictions are imposed on the space where the NMR probe (that is inserted in a quite narrow vertical bore in a superconducting magnet) is placed. Coils placed more outwardly result in lower efficiency of detection and lower irradiation efficiency. Where these considerations are taken into account, this structure is not very practical to achieve.

Theoretically, an infinite number of RF input-output ports could be mounted to the coil. However, as the number of ports increases, the efficiency of the circuitry relative to the coils deteriorates. Therefore, it can be said that a maximum number of ports used for each coil is limited to about three in terms of performance. This corresponds to the example of the inner coil of the tunable quadruple resonance probe.

Generally, it is desired that RF waves for observation and RF waves for irradiation be assigned to the inner coil and intermediate coil, respectively. If the RF waves for observation are assigned to the intermediate coil, the problem is merely that the detection sensitivity is nearly halved. Where high concentrations of samples are measured, no major problems occur in practice. Accordingly, the expressions "for observation" and "for irradiation" used in the above embodiments are used only for convenience. They should not be construed restrictively.

Accordingly, it is obvious that modifications of the above embodiments in which the wording "for observation" is replaced by "for irradiation" or the wording "for irradiation" is replaced by "for observation" are possible.

It is to be understood that Table 3 illustrates merely exemplary examples of the present invention. Assignments of RF waves of HF, LF, and LOCK to the inner coil, intermediate coil, and outermost coil can be modified as many as all possible permutational combinations. If all of them are counted, the number of combinations exceeds 500. All of these modifications are also embraced within the scope of the present invention.

The present invention can find wide use in NMR measurements.

Having thus described our invention with the detail and particularity required by the Patent Laws, what is desired protected by Letters Patent is set forth in the following claims.

The invention claimed is:

1. An NMR probe comprising:
    three coils forming layers radially spaced from each other, the layers being disposed to surround a sample tube, the three coils including an inner coil, an intermediate coil, and an outermost coil;
    said inner coil being capable of multiply resonating with RF waves (HF) of a frequency corresponding to a resonant frequency of from $^3$H nuclei to $^{19}$F nuclei and with RF waves (LF) of a frequency lower than the resonant frequency of $^{205}$Tl;
    said intermediate coil being capable of multiply resonating with the HF and LF and producing an RF magnetic field perpendicular in direction to an RF magnetic field produced by the inner coil;
    said outermost coil being capable of resonating with at least RF waves for NMR lock and producing an RF magnetic field which is perpendicular in direction to the RF magnetic field produced by the intermediate coil but which is coincident in direction with the RF magnetic field produced by the inner coil;
    a first tuning-and-matching circuit connected with the inner coil and being capable of multiply resonating with at least two different frequencies selected from a range from the LF to the HF;
    a second tuning-and-matching circuit connected with the intermediate coil and being capable of multiply resonating with at least two different frequencies selected from the range from the LF to the HF; and
    a third tuning-and-matching circuit connected with the outermost coil and being capable of being tuned to at least the RF waves for NMR lock.

2. An NMR probe as set forth in claim 1, wherein the HF, the LF, and the RF waves for NMR lock are supplied to the inner coil, the intermediate coil, and the outermost coil, respectively, during use of the NMR probe.

3. An NMR probe as set forth in claim 2, wherein another LF is supplied to the inner coil during use of the NMR probe.

4. An NMR probe as set forth in claim 1, wherein the LF, the HF, and the RF waves for NMR lock are supplied to the inner coil, the intermediate coil, and the outermost coil, respectively, during use of the NMR probe.

5. An NMR probe as set forth in claim 1, wherein the HF, two kinds of LFs, and the RF waves for NMR lock are supplied to the inner coil, the intermediate coil, and the outermost coil, respectively, during use of the NMR probe.

6. An NMR probe as set forth in claim 5, wherein further LF is supplied to the inner coil during use of the NMR probe.

7. An NMR probe as set forth in claim 1, wherein the LF, two kinds of HFs, and the RF waves for NMR lock are supplied to the inner coil, the intermediate coil, and the outermost coil, respectively, during use of the NMR probe.

8. An NMR probe as set forth in claim 7, wherein another LF is supplied to the inner coil during use of the NMR probe.

9. An NMR probe as set forth in claim 1, wherein two kinds of HFs, the LF, and the RF waves for NMR lock are supplied to the inner coil, the intermediate coil, and the outermost coil, respectively, during use of the NMR probe.

10. An NMR probe as set forth in claim 9, wherein another LF is supplied to the inner coil during use of the NMR probe.

11. An NMR probe as set forth in claim 1, wherein the HF and the LF (i), the HF and the LF (ii), and the RF waves for NMR lock (iii) are supplied to the inner coil, the intermediate coil, and the outermost coil, respectively, during use of the NMR probe.

12. An NMR probe as set forth in claim 1, wherein the HF and the LF (i), two kinds of LFs (ii), and the RF waves for NMR lock and HF for irradiation (iii) are supplied to the inner coil, the intermediate coil, and the outermost coil, respectively, during use of the NMR probe.

13. An NMR probe as set forth in claim 1, wherein the HF and two kinds of LFs (i), the LF (ii), and the RF waves for NMR lock (iii) are supplied to the inner coil, the intermediate coil, and the outermost coil, respectively, during use of the NMR probe.

14. An NMR probe as set forth in claim 1,
wherein one desired frequency selected from the range from the LF to the HF is supplied to the inner coil from a broadband frequency variable oscillator that covers the frequency range from the LF to the HF,
wherein one desired frequency selected from the range from the LF to the HF is supplied to the intermediate coil from the variable oscillator, and
wherein the RF waves for NMR lock are supplied to the outermost coil during use of the NMR probe.

* * * * *